US006791152B2

(12) United States Patent
Hwang et al.

(10) Patent No.: US 6,791,152 B2
(45) Date of Patent: Sep. 14, 2004

(54) PHOTODETECTOR DEVICE AND METHOD FOR MANUFACTURING THE SAME

(75) Inventors: Woong-lin Hwang, Kunpo (KR); Jun-young Kim, Kunpo (KR); Dong-hoon Chang, Anyang (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 307 days.

(21) Appl. No.: 09/792,028

(22) Filed: Feb. 26, 2001

(65) Prior Publication Data

US 2001/0052566 A1 Dec. 20, 2001

(30) Foreign Application Priority Data

Feb. 24, 2000 (KR) .......................................... 2000-9073

(51) Int. Cl.[7] ...................... H01L 31/0232; H01L 21/00
(52) U.S. Cl. ...................... 257/458; 257/436; 257/437; 257/440; 250/214.1; 438/48; 438/72; 438/636
(58) Field of Search ................................ 257/436, 437, 257/440, 448, 452, 458, 432; 250/214.1; 438/48, 72, 636, 93–94

(56) References Cited

U.S. PATENT DOCUMENTS 5,760,419 A  *  6/1998  Nabiev et al. ................. 257/21
6,300,650 B1 * 10/2001  Sato ........................... 257/184

* cited by examiner

Primary Examiner—Donghee Kang
(74) Attorney, Agent, or Firm—Sughrue Mion, PLLC

(57) ABSTRACT

A photodetector device includes a doped semiconductor substrate. A first intrinsic semiconductor material layer, a main reflector, a second intrinsic semiconductor material layer, an upper semiconductor material layer, which is doped the opposite as the substrate, are formed in succession on the semiconductor substrate. An upper electrode is formed on and electrically connected with the upper semiconductor layer, and a lower electrode is electrically connected to the semiconductor substrate. One of the intrinsic semiconductor layers is relatively thin to absorb incident light, while the other is relatively thick. The photodetector device, a p-i-n photodetector, has an I region including the intrinsic semiconductor layers with different thicknesses, and a main reflector therebetween. The thickness of the entire I region can be increased with a reduced transit distance for holes. Thus, low driving voltage and high sensitivity to a high frequency optical signal requirements can be realized without reducing the size of the photo-receiving area.

29 Claims, 4 Drawing Sheets

PHOTODETECTOR DEVICE AND METHOD FOR MANUFACTURING THE SAME

BACKGROUND OF THE INVENTION

1. Field of the Invention

The present invention relates to a photodetector device and a method for manufacturing the same, and more particularly, to a photodetector device capable of high speed response at low driving voltages, and a method for manufacturing the same.

2. Description of the Related Art

Optical data communications, i.e., optical interconnections, require optical signal sending and receiving portions, i.e., light emitters to produce an optical signal, and photodetectors to detect an optical signal. As the need for high speed transmission increased, optical interconnections, which are applicable for communications through local area networks (LANs), computer-to-computer, computer-to-peripheral device, board-to-board, and chip-to chip, have replaced conventional copper wire. To meet the requirements for high speed transmission, an optical interconnection requires a rapidly responsive photodetector, which is operable with low voltages.

However, a common photodetector formed of a compound semiconductor, which is used for high response speed, cannot satisfy both the need for high response speed and the need for a low driving voltage in optical interconnections for the following reasons.

For p-i-n photodetectors, which are extensively used, electrons and holes are generated in an intrinsic semiconductor material layer by the absorption of light incident through a light-receiving surface. The response characteristics of a p-i-n photodetector is determined by the duration of time required for the thusly generated electrons and holes to reach n-type and p-type semiconductor material layers and by the capacitance, which is a function of the area of the photo-receiving surface and the thickness of the intrinsic semiconductor material layer. In other words, the higher the transport speeds of the electrons and holes and the lower the capacitance, the higher the response speed.

The critical speed of electrons and holes is $1.0 \times 10^5$ m/s for a Silicon (Si) layer and $1.4 \times 10^5$ m/s for a Gallium Arsenide (GaAs) layer. Accordingly, GaAs is the preferred photodetector material, relative to Si, with respect to response speed. However, the difference in critical speed between GaAs and Si is not substantial. Thus, the response characteristics of a p-i-n photodetector are markedly influenced by the capacitance of the device.

One of the determinative factors for the capacitance of a p-i-n photodetector is the intrinsic characteristics of the material used to form the photodetector. For example, a photodetector formed of Si has a lower capacitance than one formed of GaAs due to the relatively low dielectric constant of 11.9 for Si, relative to the dielectric constant of 13.1 for GaAs.

Another factor which determines the capacitance of a p-i-n photodetector is the thickness of the intrinsic semiconductor material layer. The capacitance of the photodetector is inversely proportional to the thickness of the intrinsic semiconductor material layer. In particular, for a general p-i-n photodetector formed of Si, the intrinsic semiconductor material layer must be as thick as 20–25 $\mu$m, due to the low absorbency of Si, which has an indirect transition band gap, thereby lowering the capacitance of the photodetector.

In contrast, for a p-i-n photodetector formed of GaAs, the intrinsic semiconductor material layer can have a thickness of 3–5 $\mu$m, due to the high absorbency of GaAs, which has a direct transition band gap, thereby increasing capacitance.

Thus, a p-i-n photodetector formed of Si, which has a thick intrinsic semiconductor material layer, needs high driving voltages in order to facilitate the migration of holes generated along with electrons by light absorption, which migrate much slower than electrons, thereby increasing the response speed. Accordingly, a p-i-n photodetector formed of Si is inappropriate in application fields which require both a high speed response and a low driving voltage. In contrast, a p-i-n photodetector formed of GaAs has a thin intrinsic semiconductor material layer and thus is operable with a low driving voltage. Accordingly, p-i-n photodetectors formed of GaAs are suitable for application fields which require a low driving voltage. The high capacitance of GaAs photodetectors, however, limits their response speed.

Another factor which determines the capacitance of p-i-n photodetector is the photo-receiving area. Capacitance is proportional to the photo-receiving area, and thus capacitance can be lowered by reducing the photo-receiving area. When a GaAS photodetector is used to receive light in a high-frequency band, the photo-receiving area must be further reduced. However, for this case, a restrictive control of allowable error is required for the alignment with an optical axis, thereby increasing the packing and alignment cost.

FIG. 1 shows an example of a conventional p-i-n photodetector. The photodetector is integrated on a n-type substrate 10 beginning with an n-type semiconductor material layer 21, upon which an intrinsic, i.e., undoped, semiconductor material layer 23 and a p-type semiconductor material layer 25 are stacked in sequence. On the top of the p-type semiconductor material layer 25, an annular p-electrode 27 is formed of metal. Also, an n-electrode 29 is formed on the underside of the substrate 10.

The photodetector has a mesa 20, which is etched around the outside of the p-electrode 27 to a depth which extends just inside the n-type semiconductor material layer 21. The back side of the substrate 10 is lapped to have a desired thickness. In order to avoid the occurrence of dark current, the exposed sidewalls of the mesa 20 are covered with an insulating layer (not shown) or polyimide (not shown). For the conventional p-i-n photodetector, the top of the p-type semiconductor material layer 25 inside the p-electrode 27 serves as a photo-receiving surface 25*a*.

Another conventional p-i-n photodetector is shown in FIG. 2. In this case, the p-i-n structure is implemented on an n-type substrate 10 by diffusion. For convenience and clarity, corresponding layers having like structures and functions are denoted by the same reference numerals as in FIG. 1. Reference numeral 26 represents an insulating layer between the p-electrode 27 and the intrinsic semiconductor material layer 23.

In such conventional p-i-n photodetectors, as a reverse bias voltage is applied between the p-electrode 27 and the n-electrode 29, incident light enters the p-type semiconductor material layer 25 through the photo-receiving surface 25*a* and is absorbed in the intrinsic semiconductor material layer 23 to produce electron and hole pairs. The electrons migrate toward the n-electrode 29, while the holes migrate toward the p-electrode 27, so that a current is output in proportion to the amount of received light.

When Si is used to manufacture p-i-n photodetectors having the above configurations, a high driving voltage is needed, which limits application to, for example, optical interconnection, which requires a low driving voltage. On the other hand, if the above p-i-n photodetectors are manufactured using GaAs, designing a pre-amplifier IC for amplifying the detection signal of a photodetector becomes complicated due to the photodetector's relatively high capacitance, thereby increasing the manufacturing cost. In addition, when a smaller photo-receiving area is required to receive high-frequency light, the packaging and optical alignment costs increase.

On the other hand, conventional approaches have suggested a resonator type photodetector, as shown in FIG. 3, which is operable with low driving voltages even when the photodetector is manufactured using relatively low absorbency Si. Like a resonator, the conventional resonator type photodetector shown in FIG. 3 includes a first distributed Bragg reflector (DBR) 100 on the p-type semiconductor material layer 25, and a second DBR 101 between the intrinsic material layer 23 and the n-type semiconductor material layer 21. In FIG. 3, the same elements as those of FIG. 1 are designated with the same reference numerals.

In the resonator type photodetector, light incident on the photodetector through the first DBR 100 is repeatedly reflected between the first and second DBRs 100 and 101 and absorbed in the intrinsic material layer 25, to thereby produce electron and hole pairs. The electrons and holes migrate toward the n-type semiconductor material layer 21 and the p-type semiconductor material layer 25, respectively.

Thus, for the conventional resonator type photodetector, even if relatively low absorbency Si is used as a material for the photodetector, the intrinsic semiconductor material layer 23 can be thin, compared to the photodetectors shown in FIGS. 1 and 2. As a result, the low driving voltage requirement can be somewhat satisfied. However, the thin intrinsic semiconductor material layer 23 increases the capacitance, so that the conventional resonator type photodetector is insufficient to satisfy the high response requirement of related application fields, such as optical interconnections.

SUMMARY OF THE INVENTION

To solve the above problems, it is an objective of the present invention to provide a photodetector device and a method for manufacturing a photodetector device, which satisfy the needs for low driving voltages and good high-frequency response with a relatively large photo-receiving area, so that the photodetector device and the method can be applied to optical interconnections and other application fields.

According to an aspect of the present invention, there is provided a photodetector device including a doped semiconductor substrate, and a first intrinsic semiconductor material layer formed over the semiconductor substrate. The photodetector device further includes a main reflector formed over the first intrinsic semiconductor material layer, and a second intrinsic semiconductor material layer formed over the main reflector. An upper semiconductor material layer, which is doped with the opposite type dopant as that of the substrate, is formed over the second intrinsic semiconductor material layer. The photodetector device further includes an upper electrode, which is formed on and electrically connected to the upper semiconductor material layer, and a lower electrode, which is electrically connected to the semiconductor substrate. One of the first and second intrinsic semiconductor material layers is formed with a relatively small thickness to absorb incident light, whereas the other is formed with a relatively large thickness.

Preferably, the first intrinsic semiconductor material layer is relatively thick, the second intrinsic semiconductor material layer is relatively thin, and the photodetector device further includes an upper reflector on the upper semiconductor material layer, such that the upper reflector and the main reflector form a resonator structure, thereby increasing light absorption by the second intrinsic semiconductor material layer.

Preferably, the first intrinsic semiconductor material layer is relatively thick, the second intrinsic semiconductor material layer is relatively thin, and the photo-receiving surface of the upper semiconductor material layer and the main reflector form a resonator structure, such that incident light is absorbed in the second intrinsic semiconductor material layer.

According to another aspect of the present invention, there is provided a method for manufacturing a photodetector device, including the steps of preparing a doped semiconductor substrate, and depositing in succession on the semiconductor substrate: a relatively thick first intrinsic semiconductor material layer, a main reflector having a relatively large number of layers, a relatively thin second intrinsic semiconductor material layer, and an upper semiconductor material layer doped with the opposite type to the semiconductor substrate. The method further includes forming an upper electrode, which has a predetermined pattern for electrical contact with the upper semiconductor material layer, on a portion of the upper semiconductor material layer, such that a photo-receiving area of the upper semiconductor material layer is exposed. In addition, the method includes forming a lower electrode on the underside of the semiconductor substrate.

Preferably, the photodetector device manufacturing method further includes forming a lower semiconductor material layer, which is doped with the same dopant type as the semiconductor substrate, between the semiconductor substrate and the first intrinsic semiconductor material layer and/or forming an upper reflector layer having a small number of layers, relative to the number of layers of the main reflector, on the photo-receiving area of the upper semiconductor material layer after the depositing step and before the lower electrode forming step.

BRIEF DESCRIPTION OF THE DRAWINGS

The above objectives and advantages of the present invention will become more apparent by describing in detail preferred embodiments thereof with reference to the attached drawings, in which.

DETAILED DESCRIPTION OF THE PREFERRED EMBODIMENTS

Figure 1:
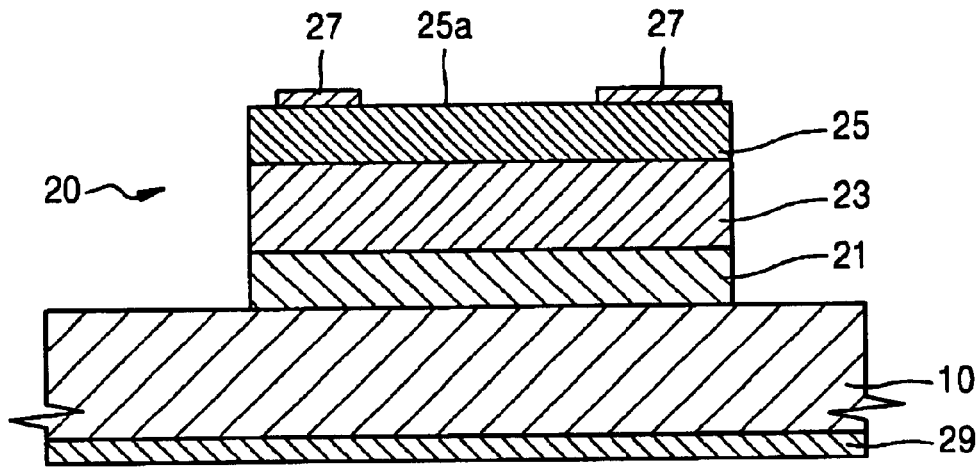
FIG. 1 is a sectional view of an example of a conventional p-i-n photodetector.
Figure 2:
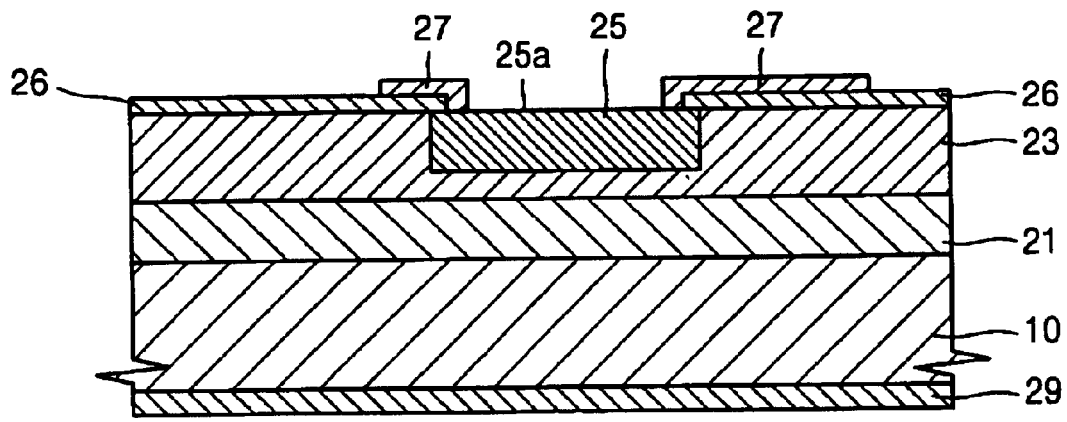
FIG. 2 is a sectional view of another example of a conventional p-i-n photodetector.
Figure 3:
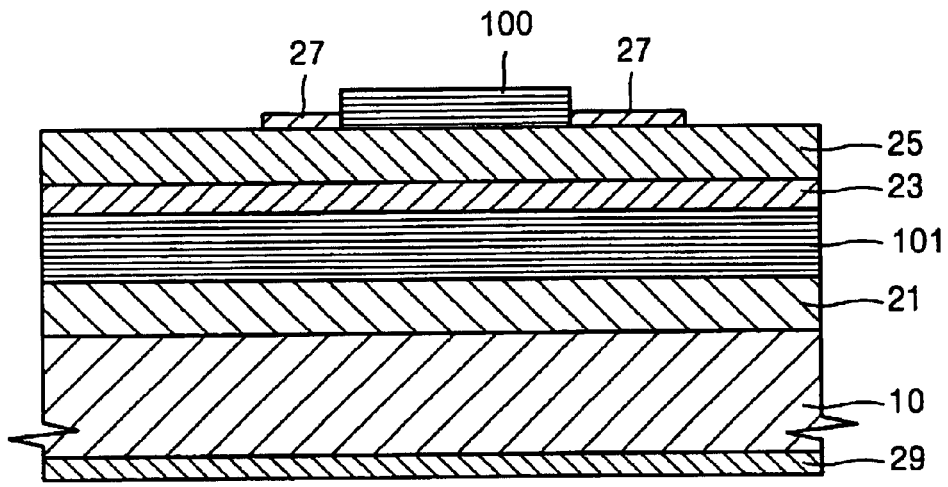
FIG. 3 is a sectional view of another example of a conventional resonator type photodetector.
Figure 4:
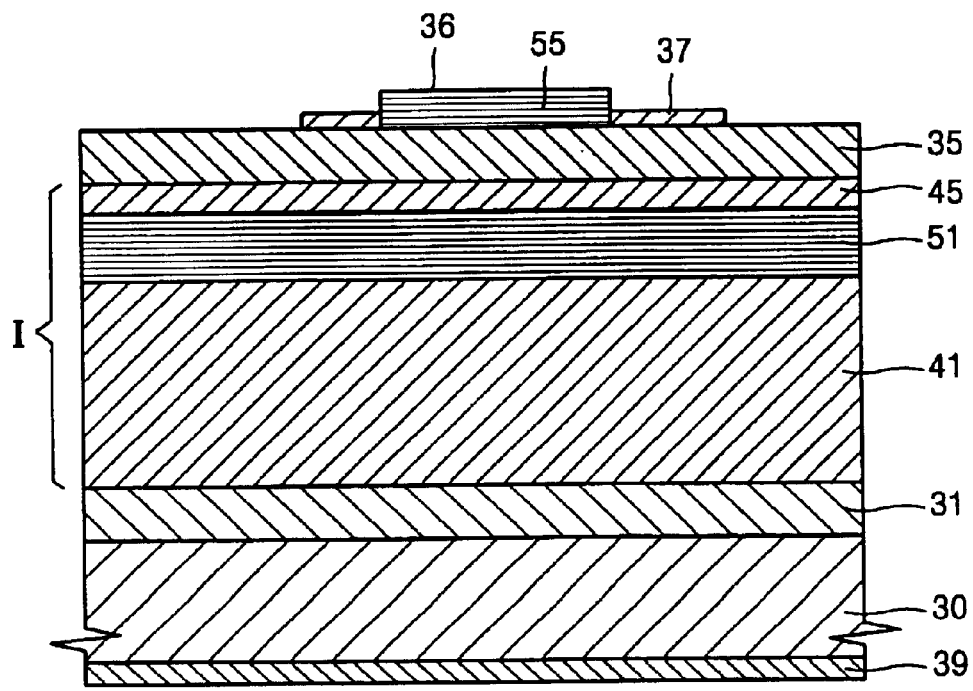
FIG. 4 is a sectional view illustrating the structure of a preferred embodiment of a photodetector device according to the present invention.

FIG. 4 illustrates a preferred embodiment of a photodetector device according to the present invention. As shown in FIG. 4, the photodetector device is integrated on a semiconductor substrate 30, upon which a first intrinsic layer 41, a main reflector 51, a second intrinsic layer 45, an upper semiconductor material layer 35, and an upper electrode 37, which is electrically connected with the upper semiconductor material layer 35, are stacked in sequence. A lower electrode 39, which is electrically connected with the semiconductor substrate 30, is formed on the underside of the semiconductor substrate 30. The photodetector device may further include a lower semiconductor material layer 31 between the semiconductor substrate 30 and the first intrinsic material layer 41, and an upper reflector 55 on the upper semiconductor material layer 35.

The semiconductor substrate 30 is formed of, for example, at least one of Si, GaAs, InGaAs and InP, and is doped with n-type dopants. The lower semiconductor material layer 31 is also doped with n-type dopants, preferably with the same n-type dopants, as the semiconductor substrate 30. The upper semiconductor material layer 35 is doped with p-type dopants opposite to the semiconductor substrate 30. The photodetector according to the present embodiment is a p-i-n photodetector with a resonator structure, which structure will be described later.

The materials used for the semiconductor substrate 30 vary depending on the wavelength of the light to be detected. For example, the semiconductor substrate 30 is formed of Si or GaAs for detecting light having a wavelength of 650–850 nm, whereas InP may be used for the semiconductor substrate 30 for detecting light having a wavelength of 1100–1600 nm.

The first and second intrinsic semiconductor material layers 41 and 45 have different thicknesses. In the present embodiment, the first intrinsic semiconductor material layer 41 is formed to be relatively thick, for example, to have a thickness of 6 μm or more. The second intrinsic semiconductor material layer 45 is formed to be relatively thin, for example, to have a thickness of 0.1–1 μm. The second intrinsic semiconductor material layer 45 forms a region for generation of electron and hole pairs by absorption of light incident through the upper semiconductor material layer 35.

The main reflector 51 formed between the first and second intrinsic semiconductor material layers 41 and 45 is a distributed Bragg reflector (DBR). The main reflector 51 is formed by alternately depositing semiconductor material layers having different refractive indices. The main reflector 51 has a relatively large number of layers, which enables it to reflect almost all incident light.

Preferably, the main reflector 51 is formed with a graded layer structure including a plurality of semiconductor material layers whose compositions gradually vary. For this case, when electrons generated by light absorption in the second intrinsic semiconductor material layer 45 drift through the main reflector 51 toward the lower semiconductor material layer 31, the resistance of the main reflector 51 decreases. As a result, the RC (resistance×junction capacitance) time constant is reduced, which is desirable in terms of providing a high photodetector response speed.

Preferably, the main reflector 51 is undoped or lightly doped with n-type dopants, and preferably the same n-type dopant as the semiconductor substrate 30, for example, with a concentration of $10^{14}$–$10^{17}$ cm$^{-3}$. If the main reflector 51 is lightly doped, the main reflector 51 can have a lower resistance.

The first semiconductor material layer 41, the main reflector 51 and the second intrinsic semiconductor material layer 45 collectively form the "I" region of the p-i-n photodetector structure. As previously described, the second intrinsic material layer of the I region, which absorbs almost all incident light, is relatively thin, thereby reducing the transit distance of holes, which have a lower mobility than electrons. In the present embodiment, the holes and electrons are generated in the second intrinsic material layer 45. As a result, although Si can be used as a material for the photodetector device according to the present embodiment, the photodetector device can operate with low voltages. In addition, when GaAs is selected to form the inventive photodetector device, the capacitance can be sharply reduced. This is because the thickness of the I region can be increased to, for example, 8 μm or more. By forming the I region as described above, the needs for both low driving voltages and a high speed response can be satisfied irrespective of which material is used to form the photodetector devices.

The surface of the upper reflector 55, which is deposited on the upper semiconductor layer 35 and surrounded by the upper electrode 37, serves as a photo-receiving area 36. Similar to the main reflector 51, the upper reflector 55 is a DBR formed by alternately stacking semiconductor materials with different refractive indices. The upper reflector 55 and the main reflector 51 form a resonator. Unlike the main reflector 51, the upper reflector 55 is formed to include a relatively small number of layers to transmit almost all external incident light into the second intrinsic semiconductor material layer 45.

Light transmitted through the upper reflector layer 55 is first absorbed by the second intrinsic semiconductor material layer 45, reflected by the main reflector 51, and then absorbed by the second intrinsic semiconductor material 45. Through this repeated absorption and reflection, almost all incident light is absorbed. This is the reason that the relatively low reflectivity of the upper reflector 55 does not greatly affect the sensitivity of the photodetector.

Figure 5:
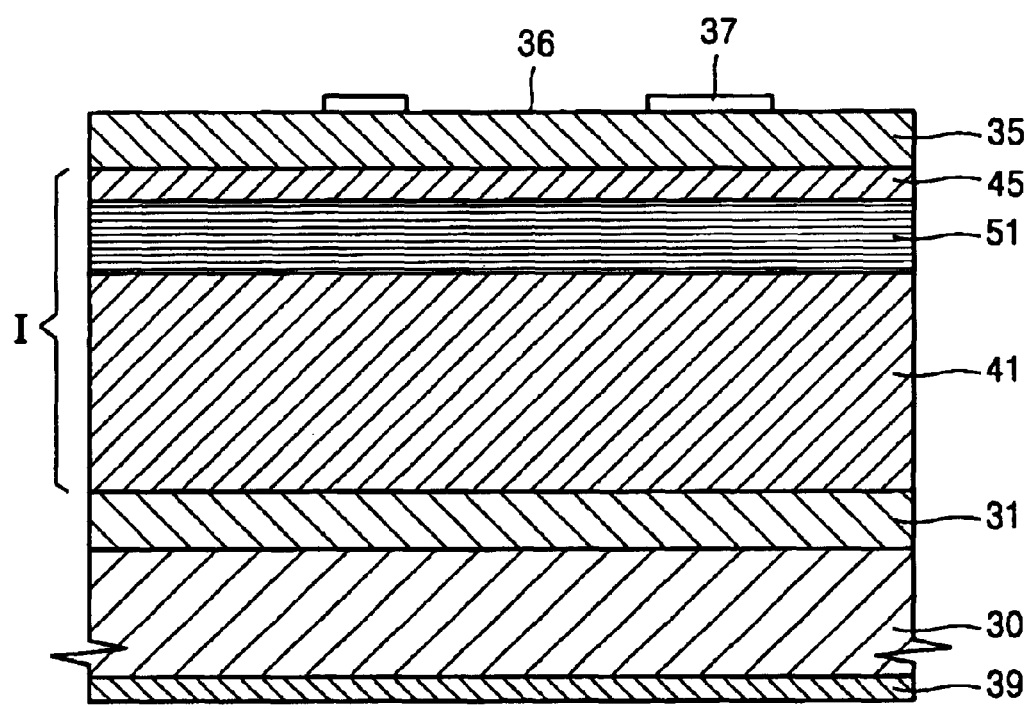
FIG. 5 is a sectional view illustrating the structure of a second preferred embodiment of a photodetector device according to the present invention.

Alternatively, the upper reflector 52 is omitted in a photodetector device according to a second embodiment of the present invention, as shown in FIG. 5. In particular, a top portion of the upper semiconductor material layer 35, which is surrounded by the upper electrode 37 and is exposed to the air, serves as the photo-receiving area 36, and the main reflector 51 forms a resonator structure. In this case, the sensitivity of the photodetector is relatively low, compared with the structure including the upper reflector 55 as shown in FIG. 4. However, this photodetector device is advantageous in that it has a low cost due to the reduced number of manufacturing steps.

The upper electrode 37 is formed with a predetermined pattern around the photo-receiving area 36 of the upper semiconductor material layer 35 and is electrically connected to the upper semiconductor material layer 35. The size of the photo-receiving area 36 is limited by the upper electrode 37. The lower electrode 39 is formed, for example, on the underside of the semiconductor substrate 30 and is electrically connected to the semiconductor substrate 30.

During operation of the photodetector device according to the present invention, almost all light incident on the upper reflector 55 through the photo-receiving area 36 surrounded by the upper electrode 37 passes through the upper reflector 55 and enters the second intrinsic semiconductor material layer 45. Almost all incident light is absorbed by the second intrinsic semiconductor material layer 45. A portion of light, which is not absorbed by the second intrinsic semiconductor material layer 45, is reflected by the main reflector 51, and then it is absorbed by the second intrinsic semiconductor material layer 45. A portion of light that passes back through the second intrinsic semiconductor material layer 45 is reflected by the upper reflector 55, and is incident on the second intrinsic semiconductor material layer 45. In other words, almost all light entering into the photodetector device through the upper reflector 55 is absorbed by the second intrinsic semiconductor material layer 45 through such repeated absorption and reflection by the resonator including the main reflector 51 and the upper reflector 55.

Electron and hole pairs are produced in the second intrinsic semiconductor material layer 45 in proportion to the amount of light absorbed. When a reverse voltage is applied between the upper electrode 37 and the lower electrode 39, the holes migrate through the upper semiconductor material layer 35 toward the upper electrode 37, while the electrons migrate through the main reflector 51, the first intrinsic semiconductor material layer 41, the lower semiconductor material layer 31 and the semiconductor substrate 30 toward the lower electrode 39. As a result, a current signal is detected in proportion to the amount of light absorbed by the second intrinsic semiconductor material layer 45.

Since the second intrinsic semiconductor material layer 45 has a relatively small thickness, the transit distance of holes, which have a relatively poor mobility, is very short. As a result, the photodetector device is able to respond to high frequency optical signals. Since holes can migrate through the thin second intrinsic semiconductor material layer 45 to the upper electrode 37 with application of a low driving voltage, the driving voltage of the photodetector device is sharply reduced. In addition, the I region of the inventive photodetector device, including the first and second intrinsic semiconductor material layers 41 and 45 and the main reflector 51, i.e., the entire intrinsic semiconductor material layer, which corresponds to the I region of a general p-i-n photodetector, is thick enough to lower the capacitance.

Therefore, when the inventive photodetector device is formed of Si, due to the small thickness of the second intrinsic semiconductor material layer 45 which absorbs light, the driving voltage can be lowered. In the case where the inventive photodetector device is formed of GaAs, the capacitance can be lowered due to the increased thickness of the entire intrinsic semiconductor material layer, i.e., the I region. The thin second intrinsic semiconductor material layer 45 helps to reduce the transit time of holes, which permits detection of high frequency optical signals.

A method for manufacturing a photodetector device according to the present invention will be described. Referring to FIG. 5, first an n-type semiconductor substrate 30 is prepared. Then, a relatively thick first intrinsic semiconductor material layer 41, a main reflector 51 with a relatively large number of layers, a relatively thin second intrinsic semiconductor material layer 45, and an upper semiconductor material layer 35 are stacked in succession over the semiconductor substrate 30. The upper semiconductor material layer 35 is doped with p-type dopants. To reduce resistance of the main reflector 51, the main reflector 51 is lightly doped with n-type dopants and/or is formed with graded layers as described above.

Next, an upper electrode 37 for electrical contact, which defines the photo-receiving area, is formed on the upper semiconductor material layer 35 with a predetermined pattern. The underside of the semiconductor substrate 30 is lapped to a predetermined thickness, and a lower electrode 39 is formed to the lapped surface, thereby completing a photodetector device. The completed photodetector device is further subjected to a packaging process. As for the photodetector device, the main reflector 51 and the top surface of the upper semiconductor material layer 35 serve as a resonator.

Alternatively, an n-type lower semiconductor material layer 31 may be further included between the semiconductor substrate 30 and the first intrinsic semiconductor material layer 41. In this case, the n-type lower semiconductor material layer 31 is deposited over the semiconductor substrate 30 prior to the deposition of the first intrinsic semiconductor material layer 41.

Alternatively, an upper reflector 55 with a relatively small number of layers, as shown in FIG. 4, may be further deposited on the upper semiconductor material layer 35, such that a resonator structure is formed along with the main reflector 51. In this case, prior to the formation of the upper electrode 37, at least one material layer for forming the upper reflector 55 is formed over the upper semiconductor material layer 35, and then partially etched to the top surface of the upper semiconductor material layer 35, thereby resulting in the upper reflector 55. Next, the upper electrode 37, which is electrically connected to the upper semiconductor material layer 35, is formed on the exposed surface of the upper semiconductor material layer 55. The top surface of the upper reflector 55, which is surrounded by the upper electrode 37, serves as the photo-receiving area 36.

Figure 6:
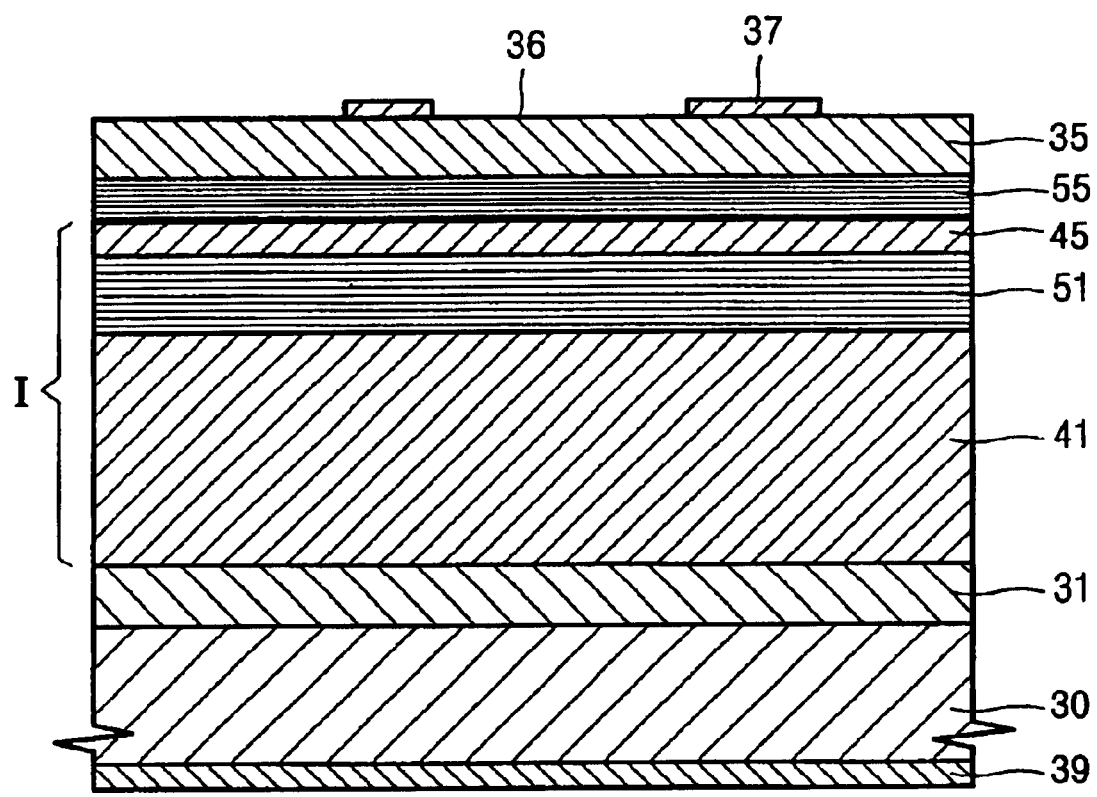
FIG. 6 is a sectional view illustrating the structure of another embodiment of a photodetector device according to the present invention.

Although the present embodiment is described with reference to the upper reflector 55 formed on the upper semiconductor material layer 35, the upper reflector 55 can be formed between the second intrinsic semiconductor material layer 45 and the upper semiconductor material layer 35 (FIG. 6).

Although, in the embodiments described previously, the photodetector devices are designed to detect light through the top surface of the upper reflector 55 or the upper semiconductor material layer 35, which is defined by the upper electrode 37, it will be apparent to those skilled in the art that various changes in form and details may be made thereto. For example, the photodetector device can be designed to receive light through the semiconductor substrate 30 by forming an opening, through which light enters the inside, or by forming the semiconductor substrate 30 with a transparent material, and moving the lower electrode 39 to another position. In this case, the upper reflector 55 is placed between the semiconductor substrate 30 and the lower semiconductor material layer 31, the first intrinsic semiconductor material layer 41 is formed to be thinner than the second intrinsic semiconductor material layer 45, and each material layer is doped with an opposite type of impurities.

As previously described, the p-i-n photodetector device according to the present invention has an I region including first and second intrinsic semiconductor material layers having different thicknesses, and a main reflector therebetween. With this structure, the thickness of the entire I region can be increased, while providing a reduced transit distance for holes, which have a relatively poor mobility. Thus, the need for low driving voltages and high sensitivity to high frequency optical signals, in application fields such as optical interconnections, can be realized without reducing the size of the photo-receiving area.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A photodetector device comprising:
   a doped semiconductor substrate having a first dopant type;
   a first intrinsic semiconductor material layer formed over said semiconductor substrate;
   a main reflector formed over said first intrinsic semiconductor material layer;
   a second intrinsic semiconductor material layer formed over said main reflector;
   an upper semiconductor material layer doped with a second dopant type, which is opposite to the first dopant type, said upper semiconductor material layer being formed over said second intrinsic semiconductor material layer;
   an upper electrode formed on and electrically connected to said upper semiconductor material layer; and
   a lower electrode electrically connected to said semiconductor substrate,
   wherein one of said first and second intrinsic semiconductor material layers is formed with a small thickness to absorb incident light, relative to the other of said first and second intrinsic semiconductor material layers, which is formed with a relatively large thickness.

2. The photodetector device of claim 1, wherein said first intrinsic semiconductor material layer is thick relative to said second intrinsic semiconductor material layer, and said main reflector and a photo-receiving surface of said upper semiconductor material layer form a resonator structure which enhances absorption of incident light in said second intrinsic semiconductor material layer.

3. The photodetector device of claim 2, wherein said first intrinsic semiconductor material layer has a thickness of 6 $\mu$m or more.

4. The photodetector of claim 3, wherein said second intrinsic semiconductor material layers has a thickness of 0.1–1 $\mu$m or more.

5. The photodetector device of claim 1, wherein said first intrinsic semiconductor material layer is thick relative to said second intrinsic semiconductor material layer, and said photodetector device further comprises an upper reflector on said upper semiconductor material layer, wherein said upper reflector and said main reflector form a resonator structure, thereby increasing light absorption by said second intrinsic semiconductor material layer.

6. The photodetector device of claim 5, wherein said first intrinsic semiconductor material layer has a thickness of 6 $\mu$m or more.

7. The photodetector of claim 6, wherein said second intrinsic semiconductor material layers has a thickness of 0.1–1 $\mu$m or more.

8. The photodetector device of claim 5, wherein said upper reflector comprises alternately deposited semiconductor material layers having different refractive indices.

9. The photodetector device of claim 1, wherein said first intrinsic semiconductor material layer is thick relative to said second intrinsic semiconductor material layer, and said photodetector device further comprises an upper reflector between said second intrinsic semiconductor material layer and said upper semiconductor material layer, wherein said upper reflector and said main reflector form a resonator structure, thereby increasing light absorption by the second intrinsic semiconductor material layer.

10. The photodetector device of claim 9, wherein said upper reflector comprises alternately deposited semiconductor material layers having different refractive indices.

11. The photodetector device of claim 9, wherein said first intrinsic semiconductor material layer has a thickness of 6 $\mu$m or more.

12. The photodetector device of claim 1, wherein said second intrinsic semiconductor material layer has a thickness of 0.1–1 $\mu$m or more.

13. The photodetector of claim 12, wherein said first intrinsic semiconductor material layers has a thickness of 6 $\mu$m or more.

14. The photodetector device of claim 1, wherein said first intrinsic semiconductor material layer has a thickness of 6 $\mu$m or more.

15. The photodetector of claim 14, wherein said second intrinsic semiconductor material layers has a thickness of 0.1–1 $\mu$m or more.

16. The photodetector device of claim 1, wherein said main reflector comprises a plurality of alternately deposited semiconductor material layers having different refractive indices.

17. The photodetector device of claim 16, wherein said main reflector is relatively lightly doped with a concentration of $10^{14}$–$10^{17}$ cm$^{-3}$.

18. The photodetector device of claim 17, wherein said main reflector is doped with the first dopant type.

19. The photodetector device of claim 16, wherein said plurality of alternately deposited semiconductor material layers have gradually varying compositions, wherein said main reflector has a relatively low resistance.

20. The photodetector device of claim 16, wherein said main reflector comprises an intrinsic semiconductor material.

21. The photodetector device of claim 20, wherein said plurality of alternately deposited semiconductor material layers have gradually varying compositions, wherein said main reflector has a relatively low resistance.

22. The photodetector device of claim 1, further comprising a lower semiconductor material layer doped with the first dopant type and positioned between said semiconductor substrate and said first intrinsic semiconductor material layer.

23. The photodetector device of claim 1, wherein said semiconductor substrate comprises at least one of Si, GaAs, InGaAs and InP.

24. The photodetector device of claim 1, wherein electrons produced by an absorption of light at the second intrinsic semiconductor layer, migrate through the main reflector toward the lower electrode when a voltage is applied between the upper and the lower electrodes.

25. The photodetector device of claim 24, wherein the electrons migrate through the main reflector, the first intrinsic semiconductor material layer, and the doped semiconductor substrate.

26. The photodetector device of claim 1 further comprising an upper reflector between said second intrinsic semiconductor material layer and said upper semiconductor material layer.

27. A method for manufacturing a photodetector device, comprising:
   preparing a semiconductor substrate doped with a first dopant type;
   depositing in succession on the semiconductor substrate:
      a first intrinsic semiconductor material layer, a main reflector comprising a first plurality of layers, a second intrinsic semiconductor material layer, and an upper semiconductor material layer doped with a second dopant type, which is opposite to the first dopant type, wherein the first intrinsic semiconductor material layer is thicker than the second intrinsic semiconductor material layer;

forming an upper electrode having a predetermined pattern for electrical contact with the upper semiconductor material layer on a portion of the upper semiconductor material layer, such that a photo-receiving area of the upper semiconductor material layer is exposed; and forming a lower electrode on an underside of the semiconductor substrate.

28. The method of claim 27, wherein said depositing step further comprises forming a lower semiconductor material layer, which is doped with the first dopant type, between the semiconductor substrate and the first intrinsic semiconductor layer, and said method further comprises forming an upper reflector layer comprising a second plurality of layers on the photo-receiving area of the upper semiconductor material layer after said depositing step and before said lower electrode forming step, wherein said first plurality of layers is greater in number than said second plurality of layers.

29. The method of claim 27, further comprising:

forming a lower semiconductor material layer, which is doped with the first dopant type, between the semiconductor substrate and the first intrinsic semiconductor layer; or forming an upper reflector layer comprising a second plurality of layers on the photo-receiving area of the upper semiconductor material layer after said depositing step and before said lower electrode forming step, wherein said first plurality of layers is greater in number than said second plurality of layers.

* * * * *